United States Patent [19]

Yokoyama

[11] Patent Number: 4,571,553

[45] Date of Patent: Feb. 18, 1986

[54] AMPLIFIER CIRCUIT WITH DISTORTION CANCELLATION FUNCTION

[75] Inventor: Kenji Yokoyama, Hamamatsu, Japan

[73] Assignee: Nippon Gakki Seizo Kabushiki Kaisha, Hamamatsu, Japan

[21] Appl. No.: 678,693

[22] Filed: Dec. 6, 1984

[30] Foreign Application Priority Data

Dec. 14, 1983 [JP] Japan .................................. 58-235955

[51] Int. Cl.$^4$ .............................................. H03F 1/26
[52] U.S. Cl. .................................. 330/149; 330/151; 330/85; 330/69
[58] Field of Search ................... 330/69, 85, 149, 151; 328/162, 163

[56] References Cited

U.S. PATENT DOCUMENTS 3,980,967  9/1976  Seidel ............................. 330/151 X
4,280,102  7/1981  Yokoyama ............................ 330/85

Primary Examiner—Eugene R. LaRoche
Assistant Examiner—Steven J. Mottola
Attorney, Agent, or Firm—Spensley, Horn, Jubas & Lubitz

[57] ABSTRACT

An amplifier circuit which amplifies an input signal with substantially zero distortion and can stably operate even at high frequencies is provided. A signal proportional to an input signal supplied to an input terminal is applied to an input terminal of a main amplifier. An output signal of this main amplifier is supplied through an impedance circuit to one of input terminals of a differential amplifier the other input terminal of which is supplied with the input signal to be amplified. An output signal of this differential amplifier is fed to a reference voltage input terminal of the main amplifier to determine a voltage potential of the input terminal of the main amplifier when a signal level of the input signal is zero, thereby distortion generated in the main amplifier being canceled.

8 Claims, 5 Drawing Figures

AMPLIFIER CIRCUIT WITH DISTORTION CANCELLATION FUNCTION

BACKGROUND OF THE INVENTION

1. Field of the Invention

This invention relates generally to an amplifier circuit for use in an audio system, and in particular to an amplifier circuit with substantially zero distortion.

2. Prior Art

There has been proposed a low distortion amplifier in which a feedback path including a distortion detection amplifier is coupled to a main amplifier to reduce distortion generated therein. There is shown in FIG. 1 such a conventional low distortion amplifier 1. This amplifier 1 essentially comprises an addition circuit 2, a main amplifier 3, an impedance circuit 4 and a distortion detection circuit 5. An input signal Ei applied to an input terminal 6 is fed via the addition circuit 2 to an input terminal of the main amplifier 3 and an output signal Eo of this main amplifier 3 is derived from an output terminal 7. This output signal Eo is, on the other hand, supplied via the impedance circuit 4 to an inverting input terminal of the distortion detection amplifier 5 whose non-inverting input terminal is supplied with the input signal Ei. And an output signal of this distortion detection amplifier 5 is applied to the addition circuit 2.

With this construction, the following equation indicative of the relation between the input signal Ei and output signal Eo is established:

$$(Ei + (Ei - Eo \cdot \beta) \cdot B)A = Eo \qquad (1)$$

where A is voltage gain of the main amplifier 3, B voltage gain of the distortion detection amplifier 5, and $\beta$ a feedback factor of the impedance circuit 4. This equation (1) gives a transfer function Gv of this amplifier 1 as follows:

$$Gv = \frac{Eo}{Ei} = \frac{(1+B) \cdot A}{1 + A \cdot B \cdot \beta} \qquad (2)$$

The above equation (2) shows that the transfer function Gv becomes ($1/\beta$) when the voltage gain B is infinite. This means that even if the main amplifier 3 generates an amount of distortion, distortion contained in the output signal Eo can be reduced to a negligible amount by setting the gain B of the distortion detection amplifier 5 to a very large value. With this amplifier 1, also, the feedback signal introduced from the output thereof into the impedance circuit 4 is first amplified by the distortion detection amplifier 5 and then again amplified by the main amplifier 3 before returning to the same output. The stability of this amplifier 1 can therefore be affected not only by the frequency response of the main amplifier 3 but also by that of the distortion detection amplifier 5. In general, an amplifier having a good phase response even at high frequencies is of a low-power type and a high-power-type amplifier having such a good phase response has not yet been available. Incidentally, the distortion detection amplifier 5 shown in FIG. 1 need not perform a power-amplification and may therefore be of a low-power type that can have a good phase response. On the contrary, the main amplifier 3 must perform a power-amplification and must therefore be of a high-power type, however such a high-power-type amplifier is generally poor in phase response. For this reason, it has been quite difficult to improve at high frequencies the stability of this kind of conventional low-distortion amplifier. And as a result, such a conventional low-distortion amplifier is liable to oscillate at high frequencies.

SUMMARY OF THE INVENTION

It is therefore an object of this invention to provide an amplifier circuit in which distortion can effectively be reduced.

It is another object of this invention to provide an amplifier circuit which operates stably even at high frequencies.

According to the present invention, there is provided an amplifier circuit with distortion cancellation function comprising an input signal terminal for receiving an input signal to be amplified; a main amplifier for amplifying the input signal, the main amplifier having an input terminal for being supplied with a signal proportional in signal level to the input signal, a reference voltage input terminal for being supplied with a reference voltage, and an output terminal for outputting an output signal thereof, a voltage potential of the input terminal of the main amplifier when a signal level of the input signal is zero being determined by the reference voltage; an impedance circuit for being supplied with the output signal of the main amplifier; a differential amplifier for supplying an output signal thereof to the reference voltage input terminal as the reference voltage, one of input terminals of the differential amplifier being supplied with the output signal of the main amplifier through the impedance circuit, the other of the input terminals of the differential amplifier being supplied with the input signal to be amplified, an output terminal of the differential amplifier being coupled to the reference voltage input terminal of the main amplifier; and an output signal terminal for deriving the output signal of the main amplifier therefrom. The amplifier circuit according to the present invention may further comprise a voltage-to-current converter connected between the input signal terminal and the input terminal of the main amplifier.

DESCRIPTION OF THE PREFERRED EMBODIMENTS OF THE INVENTION

Figure 1:
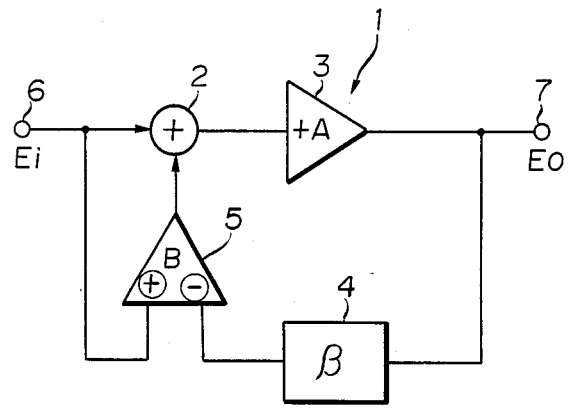
FIG. 1 is a block diagram of a conventional low-distortion amplifier.
Figure 2:
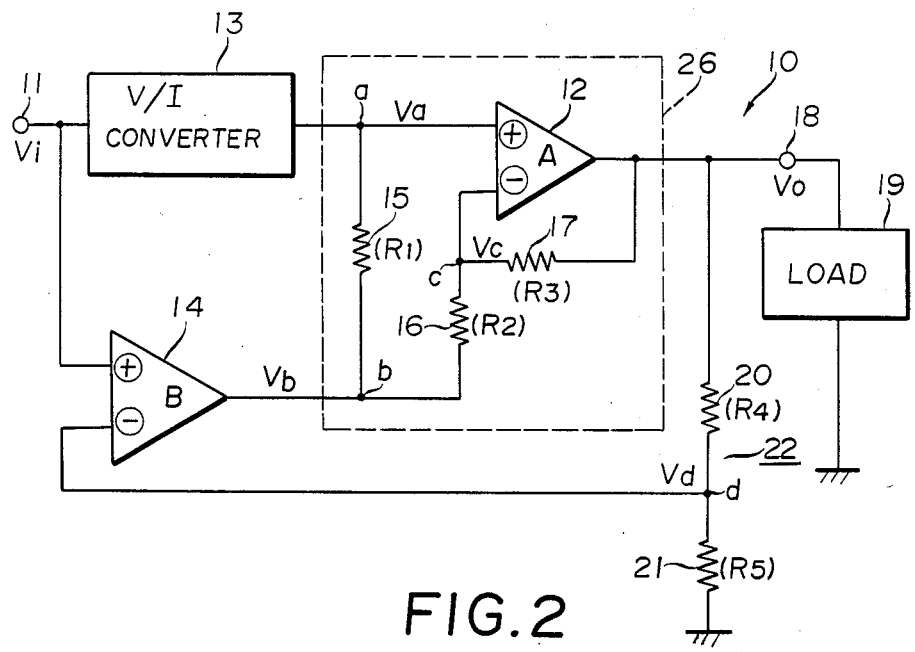
FIG. 2 is a circuit diagram of an amplifier circuit provided in accordance with the present invention.

Referring now to FIG. 2, there is shown an amplifier circuit 10 provided in accordance with the present invention. An input terminal 11 of this amplifier circuit 10 is connected to a non-inverting input terminal of an amplifier 12 via a voltage-to-current converter (hereinafter referred to as V/I converter) 13, the amplifier 12 having an open-loop voltage gain A. The input terminal 11 is also connected to a non-inverting input terminal of a distortion cancellation amplifier 14 which is composed of a differential amplifier. An output terminal of this distortion cancellation amplifier 14 is connected via a resistor 15 having a resistance value R1 to the non-inverting input terminal of the amplifier 12, and is connected via a resistor 16 having a resistance value R2 to an inverting input terminal of the same amplifier 12. The inverting input terminal of the amplifier 12 is connected to its output terminal via a resistor 17 having a resistance value R3. These resistors 15 to 17 cooperate with the amplifier 12 to form a main amplifier 26 in this amplifier circuit 10. An output terminal of this main amplifier 26 or the output terminal of the amplifier 12 is connected to an output terminal 18 of this amplifier circuit 10, a load 19 being connectable between the output terminal 18 and ground. Two resistors 20 and 21 having values R4 and R5, respectively, are serially connected between the output terminal of the main amplifier 26 and ground, these resistors 20 and 21 constituting an impedance circuit 22 in this amplifier circuit 10. A junction point d of the resistors 20 and 21 is connected to an inverting input terminal of the distortion cancellation amplifier 14. In this case, R2, R3, R4 and R5 of the resistors 16, 17, 20 and 21 are set to such values that establish the following equation (3):

$$R3/R2 = R4/R5 \tag{3}$$

Also, the value R1 of the resistor 15 is determined by the following equation:

$$g \cdot R1 = 1 \tag{4}$$

where g is a conversion transconductance of the V/I converter 13.

It is appreciated from the above equation (4) that a voltage appearing across the resistor 15 becomes equal to the voltage Vi of the input signal applied to the input terminal 11. And therefore, a voltage Va at a point a in the main amplifier 26 can be given by the following equation:

$$Va = Vi + Vb \tag{5}$$

where Vb is a voltage at a point b in the main amplifier 26. As can be seen from FIG. 2, the point b is a reference voltage input terminal of the main amplifier 26 which operates as a non-inverting amplifier. And when it is assumed that the amplifier 12 generates distortion D therein, a voltage Vo at the output terminal 18 is given by the following equation:

$$Vo = (Va - Vc) \cdot A + D \tag{6}$$

where Vc is a voltage at a point c in the main amplifier 26. This voltage Vc can be expressed as $$Vc = (Vo - Vb) \cdot \frac{R2}{R3 + R2} + Vb \tag{7}$$

and therefore the equation (6) can be modified using the equations (5) and (7) to obtain $$Vo = \left( Vi - (Vo - Vb) \cdot \frac{R2}{R3 + R2} \right) \cdot A + D \tag{8}$$

Also, the voltage Vb is given by the following equation:

$$Vb = \left( Vi - Vo \cdot \frac{R5}{R4 + R5} \right) \cdot B \tag{9}$$

where B is a voltage gain of the distortion cancellation amplifier. From the above equations (8) and (9), the next equation (10) can be obtained $$Vi \cdot A \cdot (1 + B \cdot \beta) + D = Vo \cdot (1 + A \cdot \beta + A \cdot B \cdot \beta^2) \tag{10}$$

where $\beta$ represents R2/(R2+R3) or R5/(R4+R5). And if the gain A and gain B are both infinite, this equation (10) gives the following approximation:

$$Vi \cdot A \cdot B \cdot \beta + D = Vo \cdot A \cdot B \cdot \beta^2 \tag{11}$$

This equation (11) can also be expressed as $$\frac{Vi}{\beta} + \frac{D}{A \cdot B \cdot \beta^2} = Vo \tag{12}$$

It is appreciated from the above equation (12) that with this amplifier circuit 10 the distortion D generated by the main amplifier 26 can be reduced to $(1/A \cdot B \cdot \beta^2) \cdot D$ and that the transfer function thereof is rendered substantially equal to $(1/\beta)$ and can therefore be determined only by $\beta$ as that of a conventional amplifier.

Further, with the structure of this amplifier circuit 10, a voltage Vd at the point d $(Vd = Vo \cdot \beta)$ is rendered equal in value to the voltage Vi by the provision of the distortion cancellation amplifier 14. It is therefore appreciated from the above equation (9) that if the main amplifier 26 generates no distortion the voltage Vb becomes zero, thereby the voltage Vc being rendered equal to the voltage Vd. And in the case where the main amplifier 26 generates any distortion, the distortion cancellation amplifier 14 outputs the voltage Vb of such a value that renders the voltage Vd equal to the voltage Vi.

The effect of the voltage Vb upon the voltage Vo will now be described.

Figure 3:
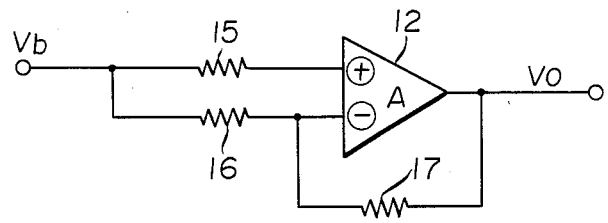
FIG. 3 is a circuit diagram of a portion of the amplifier circuit of FIG. 2 for showing the relation between the voltages Vb and Vo appearing in the amplifier circuit.

The point b in this amplifier circuit 10 is a reference voltage input terminal of the main amplifier 26. In general, such a reference voltage input terminal is supplied with a reference voltage equal to zero by grounding itself, although the point b in this amplifier circuit 10 is supplied with the voltage Vb outputted from the distortion cancellation amplifier 14. The relation between the voltages Vb and Vo is more clearly shown in FIG. 3 from which it is apparent that the transfer function of the circuit portion between the two voltages Vb and Vo is "1". From this, it is also appreciated that the main amplifier 26 operates only as a buffer amplifier with respect to the voltage Vb. In other words, the voltage Vb, i.e. a distortion cancellation signal, is not subjected to the amplification along the main signal path of this amplifier circuit 10, which signal path is poor in phase response. This amplifier circuit 10 is therefore stable even at high frequencies and has a very high pole frequency from which phase shift begins to increase. As a result, the amplifier circuit 10 can perform a very stable amplification of signals in an audio frequency range.

Figure 4:
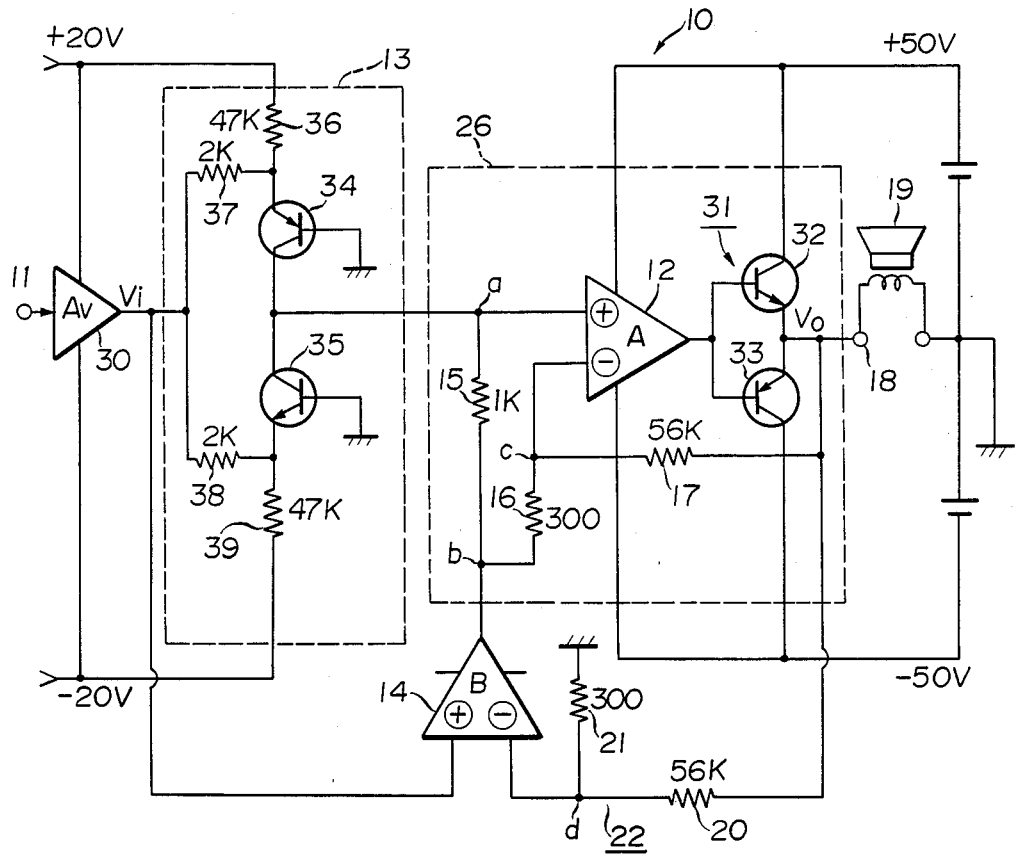
FIG. 4 is a circuit diagram showing the specific construction of the amplifier circuit of FIG. 2.

FIG. 4 shows in more detail the construction of the amplifier circuit 10 which is applied as an audio power-amplifier.

This amplifier circuit 10 comprises a preamplifier 30 between the input terminal 11 and the V/I converter 13, and a power-amplification section 31 between the amplifier 12 and the output terminal 18, the power-amplification section 31 having a NPN transistor 32 and a PNP transistor 33 complementarily connected to each other. The V/I converter 13 of this amplifier circuit 10 comprises two transistors 34 and 35 complementarily connected to each other, and four resistors 36 to 39.

Figure 5:
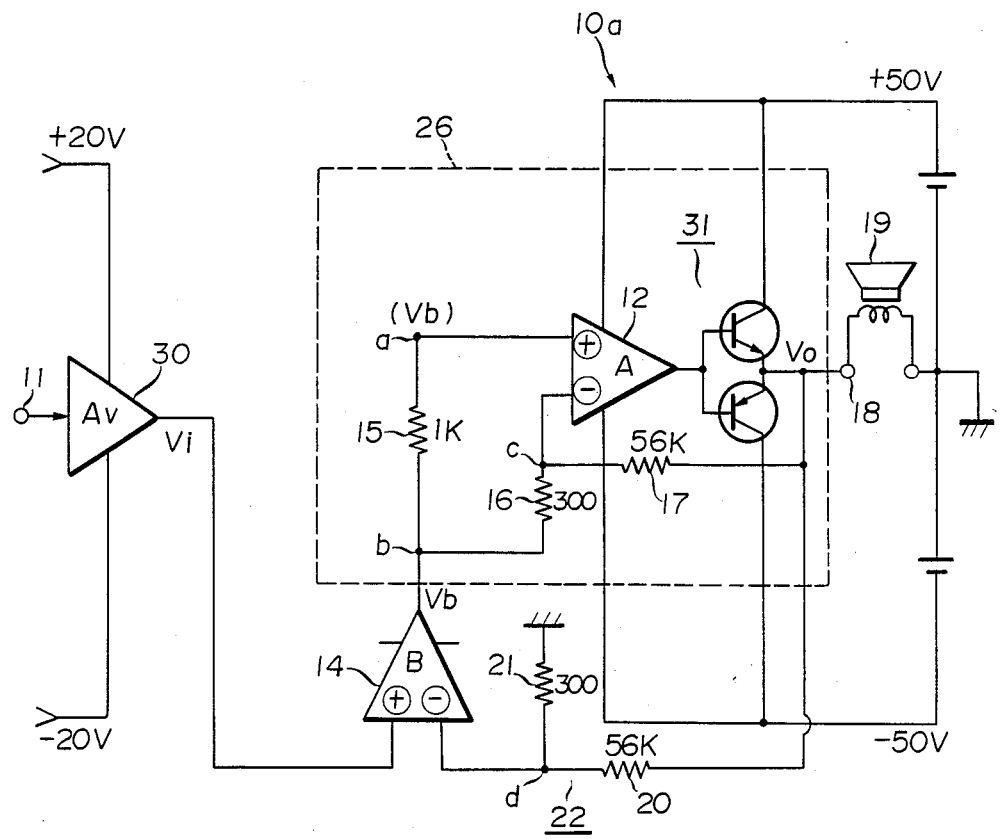
FIG. 5 is a circuit diagram of a modified amplifier circuit of the circuit shown in FIG. 4.

FIG. 5 shows a modified amplifier circuit 10a which differs from the amplifier circuit 10 of FIG. 4 only in that it has no V/I converter between a preamplifier 30 and an amplifier 12.

With the construction of this amplifier circuit 10a, the following equation (13), which corresponds to the equation (8) for the amplifier circuit 10, is established:

$$Vo=(Vb-(Vo-Vb)\cdot\beta)\cdot A+D \tag{13}$$

With this amplifier circuit 10a, the above equation (9) is also established, and these equations (9) and (13) give the next equation (14).

$$Vi\cdot A\cdot B\cdot(1+\beta)+D=Vo\cdot(1+A\cdot\beta+A\cdot B\cdot\beta+A\cdot B\cdot\beta^2) \tag{14}$$

The gain A and gain B are both infinite, and therefore the above equation (14) can be simplified to $$Vi\cdot A\cdot B\cdot(1+\beta)+D=Vo\cdot A\cdot B\cdot(1+\beta) \tag{15}$$

This equation (15) can be further modified to obtain $$\frac{Vi}{\beta}+\frac{D}{A\cdot B\cdot\beta\cdot(1+\beta)}=Vo \tag{16}$$

It is appreciated from this equation (16) that with this amplifier circuit 10a the distortion D is reduced to $D/A\cdot B\cdot\beta\cdot(1+\beta)$ and that the transfer function of this amplifier circuit 10a is equal to $(1/\beta)$ and thus can be determined only by $\beta$.

What is claimed is:

1. An amplifier circuit with distortion cancellation function comprising:
   (a) input terminal means for receiving an input signal to be amplified;
   (b) main amplifier means for amplifying said input signal, said main amplifier means having an input terminal for being supplied with a signal proportional in signal level to said input signal, a reference voltage input terminal for being supplied with a reference voltage, and an output terminal for outputting an output signal thereof, a voltage potential of the input terminal of said main amplifier means at the time when a signal level of said input signal is zero being determined by said reference voltage;
   (c) impedance circuit means for being supplied with said output signal of said main amplifier means;
   (d) differential amplifier means for supplying an output signal thereof to said reference voltage input terminal as said reference voltage, one of input terminals of said differential amplifier means being supplied with the output signal of said main amplifier means through said impedance circuit means, the other of the input terminals of said differential amplifier means being supplied with said input signal to be amplified, an output terminal of said differential amplifier means being coupled to the reference voltage input terminal of said main amplifier means; and
   (e) output terminal means for deriving the output signal of said main amplifier means therefrom;
   wherein said main amplifier means is a current input type amplifier in which the input terminal is controlled by a current of said input signal;
   wherein said main amplifier means has a transfer function of one (1) between said reference voltage input terminal and said output terminal;
   wherein said main amplifier means comprises a first resistor, a second resistor having a resistance value R2, a third resistor having a resistance value R3, and an amplifier having an open-loop gain A and having inverting input, non-inverting input and output terminals, said non-inverting input terminal being connected to the input terminal of said main amplifier means, said first resistor being connected between said non-inverting input terminal and said reference voltage input terminal, said second resistor being connected between said inverting input terminal and said reference voltage input terminal, said third resistor being connected between the inverting and output terminals of said amplifier;
   wherein said differential amplifier means has a voltage gain B; and
   wherein said impedance circuit means comprises a fourth resistor having a resistance value R4 and a fifth resistor having a resistance value R5, said fourth and fifth resistors being serially connected in this order between the output terminal of said main amplifier means and ground, a junction point of said fourth and fifth resistors being connected to said one of the input terminals of said differential amplifier means, and wherein
   $R2/(R2+R3)=R5/(R4+R5)$,
   $A>>0$, and
   $B>>0$.

2. An amplifier circuit with distortion cancellation function according to claim 1 further comprising a voltage-to-current converter connected between said input terminal means and the input terminal of said main amplifier means.

3. An amplifier circuit with distortion cancellation function according to claim 1, wherein said input signal applied to said input terminal means is supplied to the input terminal of said main amplifier means via said differential amplifier means.

4. An amplifier circuit with distortion cancellation function according to claim 2, wherein said voltage-to-current converter comprises a transistor pair consisting of PNP and NPN transistors whose bases are grounded, sixth and seventh resistors having same values and connected between emitters of said PNP and NPN transistors, positive and negative voltage sources, an eighth resistor connected between the emitter of said PNP transistor and said positive voltage source, and a ninth resistor having a value equal to that of said eighth resistor and connected between the emitter of said NPN transistor and said negative voltage source, a junction point of said sixth and seventh resistors being connected to said input terminal means, both collectors of said PNP and NPN transistors being connected to the input terminal of said main amplifier means.

5. An amplifier circuit with distortion cancellation function according to claim 4 further comprising a preamplifier connected between said input terminal means and the junction point of said sixth and seventh resistors.

6. An amplifier circuit with distortion cancellation function according to claim 3 further comprising a pre-amplifier connected between said input terminal means and the other input terminal of said differential amplifier means.

7. An amplifier circuit with distortion cancellation function according to claim 5, wherein said main amplifier means further comprises a complementary push-pull amplifier circuit for outputting a power-amplified output to said output terminal means.

8. An amplifier circuit with distortion cancellation function according to claim 6, wherein said main amplifier means further comprises a complementary push-pull amplifier circuit for outputting a power-amplified output to said output terminal means.

* * * * *